United States Patent
Zhou et al.

(10) Patent No.: US 8,400,634 B2
(45) Date of Patent: Mar. 19, 2013

(54) SEMICONDUCTOR WAFER ALIGNMENT MARKERS, AND ASSOCIATED SYSTEMS AND METHODS

(75) Inventors: Jianming Zhou, Boise, ID (US); Craig A. Hickman, Meridian, ID (US); Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 525 days.

(21) Appl. No.: 12/702,026

(22) Filed: Feb. 8, 2010

(65) Prior Publication Data
US 2011/0194112 A1    Aug. 11, 2011

(51) Int. Cl.
*G01B 11/00* (2006.01)
*H01L 23/544* (2006.01)
*H01L 21/76* (2006.01)

(52) U.S. Cl. .......................... 356/401; 257/797; 438/401

(58) Field of Classification Search ........................ None
See application file for complete search history.

(56) References Cited

U.S. PATENT DOCUMENTS

| | | | |
|---|---|---|---|
| 5,298,365 A * | 3/1994 | Okamoto et al. ............. | 430/311 |
| 6,451,488 B1 * | 9/2002 | Rhodes ............................. | 430/5 |
| 6,864,956 B1 | 3/2005 | Teong et al. | |
| 6,921,916 B2 | 7/2005 | Adel et al. | |
| 7,439,531 B2 | 10/2008 | Van Bilsen et al. | |
| 7,508,976 B1 | 3/2009 | Yang et al. | |
| 7,989,966 B2 * | 8/2011 | Warnaar ......................... | 257/797 |
| 2004/0114143 A1 * | 6/2004 | Van Haren et al. ............ | 356/401 |
| 2004/0212796 A1 * | 10/2004 | Adel et al. ................. | 356/237.1 |
| 2006/0001879 A1 * | 1/2006 | Presura et al. ................. | 356/401 |
| 2007/0054201 A1 * | 3/2007 | Hung et al. ........................ | 430/5 |
| 2009/0310113 A1 * | 12/2009 | Musa et al. ..................... | 355/70 |
| 2010/0073688 A1 * | 3/2010 | Abdulhalim et al. ......... | 356/625 |
| 2010/0081068 A1 * | 4/2010 | Kim ................................. | 430/5 |

\* cited by examiner

*Primary Examiner* — Tarifur Chowdhury
*Assistant Examiner* — Gordon Stock, Jr.
(74) *Attorney, Agent, or Firm* — Perkins Coie LLP

(57) ABSTRACT

Semiconductor wafer alignment markers and associated systems and methods are disclosed. A wafer in accordance with a particular embodiment includes a wafer substrate having an alignment marker that includes a first structure and a second structure, each having a pitch, with first features and second features positioned within the pitch. The first features are positioned to generate first phase portions of an interference pattern, with at least one of the first features having a width different than another of the first features in the pitch, and with the second features positioned to generate second phase portions of the interference pattern, with the second phase portions having a second phase opposite the first phase, and with at least one of the second features having a width different than that of another of the second features in the pitch. The pitch for the first structure is different than the pitch for the second structure.

27 Claims, 15 Drawing Sheets

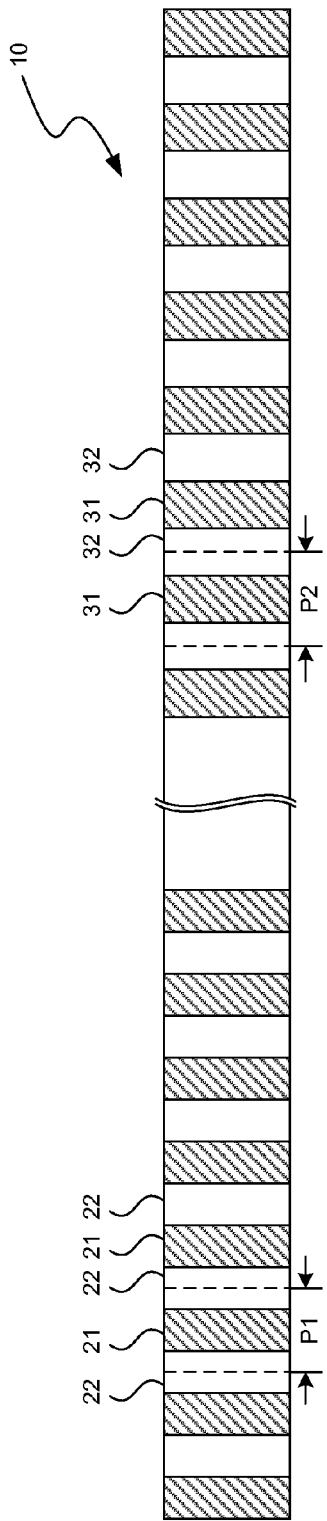
FIG. 1 *(Prior Art)*
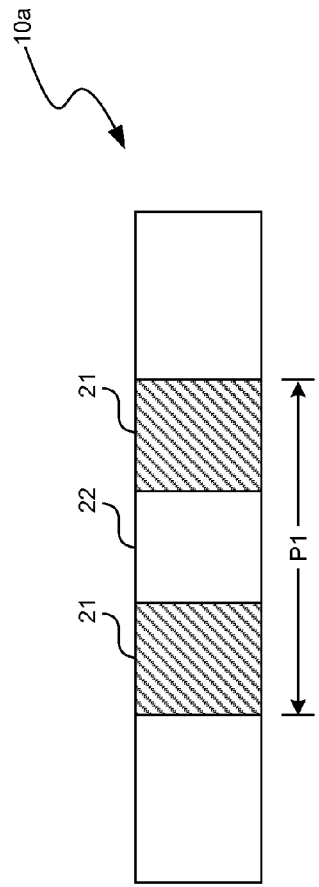
FIG. 2A *(Prior Art)*

SEMICONDUCTOR WAFER ALIGNMENT MARKERS, AND ASSOCIATED SYSTEMS AND METHODS

TECHNICAL FIELD

The present disclosure is directed generally to semiconductor wafer alignment markers, and associated systems and methods, including alignment markers specifically tailored to enhance selected diffraction orders, and/or having features with unequal widths.

BACKGROUND

Semiconductor chips used are in a wide variety of microelectronic devices and are typically manufactured on a semiconductor wafer. The semiconductor wafer typically undergoes a wide variety of sequential processing steps during fabrication. At many points during the fabrication process, it is desirable to precisely align the semiconductor wafer relative to the tool performing the processes, to ensure that the processes are performed on the correct portion of the wafer. To aid in establishing the proper alignment between the wafer and the tool, semiconductor wafers accordingly include alignment markers. The alignment markers generally include a series of scribe lines or other features that produce an interference pattern when illuminated with radiation at a selected wavelength. The position of the wafer can be determined and adjusted as necessary by detecting the interference pattern produced by the radiation reflected from the alignment markers.

FIG. 1 is a partially schematic illustration of an alignment marker 10 configured in accordance with the prior art. The alignment marker 10 includes a first structure 20 and a second structure 30. The first structure 20 includes first features 21 and second features 22 interposed between neighboring first features 21. The first and second features 21, 22 are arranged in a repeating pattern having a pitch P1. The second structure 30 includes first features 31 and second features 32 interposed between neighboring first features 31, with the first and second features 31, 32 arranged in a repeating pattern having a second pitch P2. The first pitch P1 and the second pitch P2 are slightly different (e.g. by a factor of about 10%) so as to produce a combined interference pattern that is suitable for coarse alignment. Accordingly, the combined interference pattern produced by the first structure 20 and the second structure 30 can provide for coarse alignment, and the interference pattern produced by the features of either the first structure 20 or the second structure 30 alone can be used for fine alignment.

The diffraction patterns produced by the alignment marker 10 shown in FIG. 1 have multiple diffraction orders (e.g. first order, second order, third order, etc.). One drawback with the foregoing approach is that much of the radiant energy in the interference pattern may be focused in the first order. However, the first order is typically located at the center of the diffraction pattern and is therefore not very sensitive to spatial variations. Accordingly, it is desirable to increase the resolution obtained from the diffraction patterns by directing more energy to the higher diffraction orders than to the lower diffraction orders.

FIGS. 2A-2D illustrate alignment markers 10a-10d, respectively, configured to focus more energy in higher diffraction orders. For example, FIG. 2A illustrates an alignment marker 10a that replaces a single first feature within a given pitch P1 with two first features 21, and an intermediate second feature 22, so as to emphasize the third diffraction order. Each of the first features 21 and the second feature 22 have an equal width and are centered in the region normally occupied by the first feature 21 shown in FIG. 1. In FIG. 2B, a similar approach is used for an alignment marker 10b to emphasize the fifth diffraction order. In particular, three first features 21 and two intermediate second features 22, each with equal widths, are positioned in the region normally occupied by the first feature 21 shown in FIG. 1. FIG. 2C illustrates a similar approach for enhancing the seventh order. Specifically, the alignment marker 10c has four first features 21 and three intermediate second features 22, each with equal widths, and positioned in the region normally occupied by the first feature 21 shown in FIG. 1.

The marks shown in FIGS. 2A-2C have produced wafer quality improvements relative to the marks shown in FIG. 1, but the need to provide spatial discrimination for smaller and smaller features demands still further enhanced resolution. FIG. 2D illustrates a single alignment marker 10d having first and second features 21, 22, each with an equal width, evenly distributed over the entire pitch P1, rather than just the central portion of the pitch P1. The alignment marker 10d is intended to enhance the concentration of radiation for the fifth diffraction order. However, the single structure of the alignment marker 10d is not suitable for both fine and coarse alignment. Accordingly, there remains a need for improved alignment features.

BRIEF DESCRIPTION OF THE DRAWINGS

FIG. 1 is a schematic illustration of an alignment marker configured in accordance with the prior art.

FIGS. 2A-2D illustrate alignment markers configured in accordance with further aspects of the prior art.

DETAILED DESCRIPTION

Figure 2B:
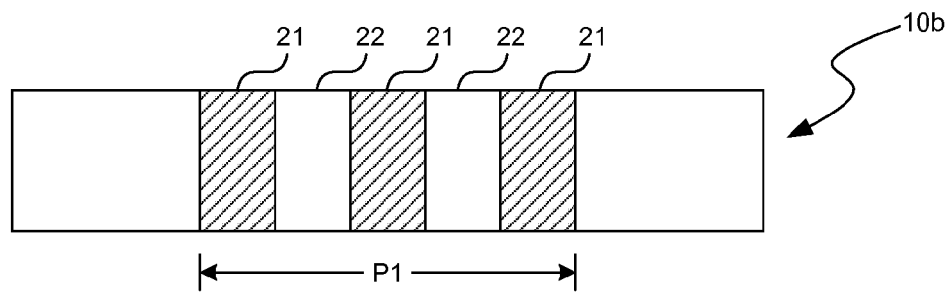

The present disclosure is directed generally to semiconductor wafer alignment markers, and associated systems and methods. In particular embodiments, the alignment markers are specifically tailored to enhance the intensity of selected diffraction orders. Specific details of several embodiments of the disclosure are described below with reference to particular wafer alignment markers to provide a thorough understanding of these embodiments. Several details describing structures or processes that are well-known and often associated with alignment markers and their use, but that may unnecessarily obscure some significant aspects of the disclosure, are not set forth in the following description for purposes of clarity. Moreover, although the following disclosure sets forth several particular embodiments, several other embodiments can have different configurations, arrangements, and/or components than those described in this section. As such, the disclosure can include other embodiments with additional elements, or without several of the elements described below with reference to FIGS. 3-14.

A semiconductor wafer in accordance with a particular embodiment includes a substrate having an alignment marker, with the alignment marker including a first structure and a second structure. Each of the first and second structures has a pitch with first features and second features. The first features are positioned in the pitch to generate first phase portions of an interference pattern, with at least one of the first features having a width different than that of another of the first features in the pitch. Second features are positioned adjacent to the first features to generate second phase portions of the interference pattern, the second phase portions having a second phase opposite the first phase, with at least one of the second features having a width different than that of the another of the second features in the pitch. The pitch for the first structure is less than the pitch for the second structure.

A method for making an alignment marker for a semiconductor wafer in accordance with a particular embodiment of the disclosure includes selecting a reinforced diffraction order N, where N is an integer greater than one, and selecting a pitch P equal to a pitch distance. The method further includes, for a first structure of the alignment marker, positioning multiple first features within the pitch to generate first phase portions of an interference pattern. The first features include a central first feature located at the center of the pitch, and multiple outer first features. On each side of the central first feature, an equal number of outer first features are positioned, with each outer first feature spaced apart from the center of the pitch by a value at least approximately equal to $M*(P/N)$, where M is each integer value up to and including a value for which $M*(P/N)=P/2$. On each side of the central first feature, an equal number of second features are positioned to generate second phase portions of the interference pattern, with the second phase being opposite the first phase, and with each second features spaced apart from the center of the pitch by a value at least approximately equal to $(2M-1)*(P/2N)$, where M is each integer value up to and including a value for which $(2M-1)*(P/2N)=P/2$. For a second structure of the marker, adjacent to the first structure, the pitch P is reselected to be greater than or less than the pitch distance, and the operations of positioning the first features and second features are repeated.

It is expected that wafers with alignment markers having the foregoing characteristics can further enhance the ability of a manufacturer to accurately and repeatedly align the wafers during fabrication. Further details of the foregoing and other embodiments are described below with reference to FIGS. 3-14.

Figure 3:
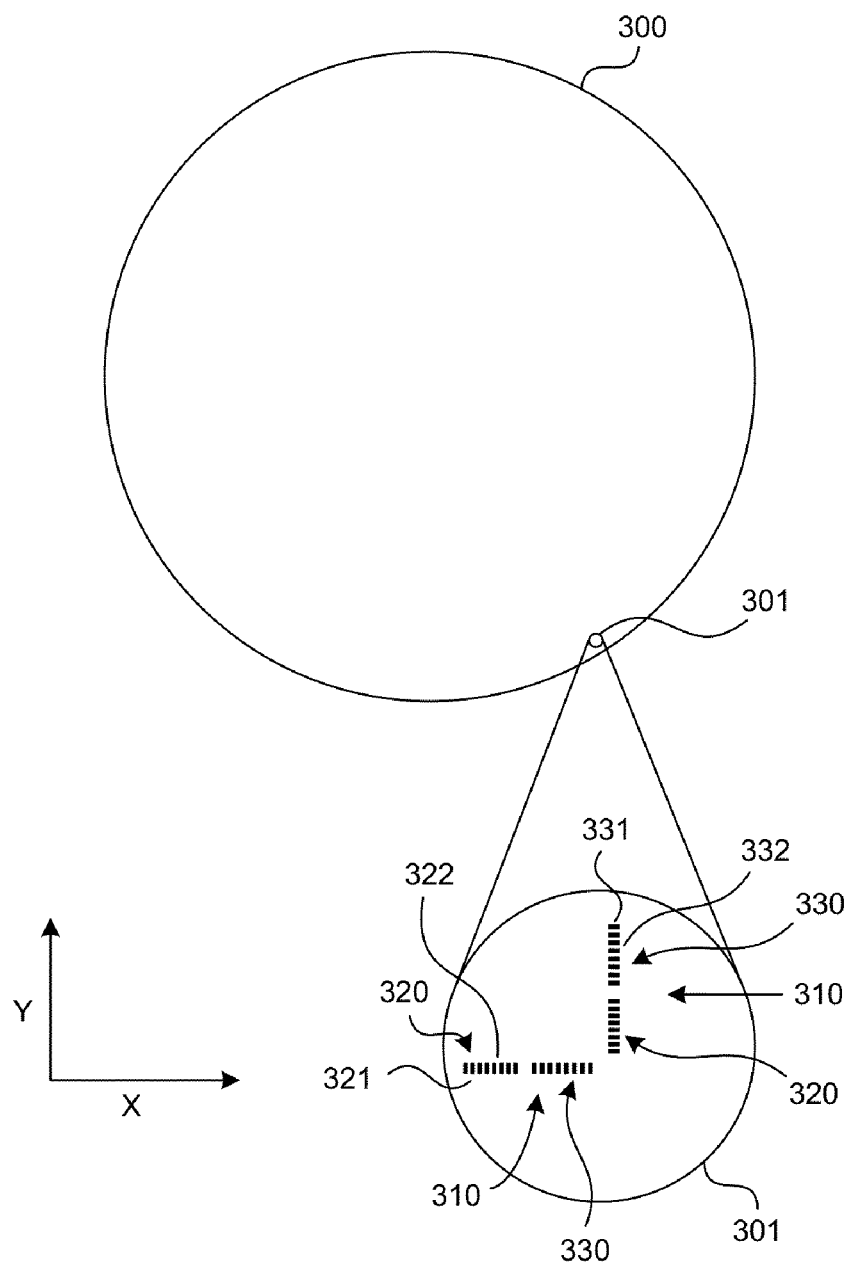
FIG. 3 is a partially schematic illustration of a semiconductor wafer having alignment markers configured in accordance with an embodiment of the disclosure.

FIG. 3 is a partially schematic illustration of a semiconductor wafer 300 having an alignment marker region 301. The location of the alignment marker region 301 is for illustrative purposes, and in other embodiments, can have other locations, patterns and/or other features. FIG. 3 also illustrates an enlarged view of the alignment marker region 301, illustrating two alignment markers 310, each arranged along generally orthogonal axes, so as to facilitate aligning the semiconductor wafer 300 relative to two orthogonal axes (e.g. an X axis and a Y axis). Each of the alignment markers 310 includes a first structure 320 and a second structure 330. Each of the first and second structures 320, 330 can include an alternating pattern of first features 321 and second features 322. In a particular example, the first features 321 can take the form of projections or plateaus and the second features 322 can take the form of recesses (or vice versa). In other embodiments, the features 321, 322 can have other suitable arrangements. For purposes of illustration, the first and second features 321, 322 are shown in FIG. 3 as adjacent dark and light bars. In any of thee embodiments, the interference pattern that results when the first and second structures 320, 330 are irradiated can be used to provide for coarse alignment of the semiconductor wafer 300, and the interference pattern produced by either one of the first and second structures 320, 330 alone, can be used to provide for fine alignment of the semiconductor wafer 300.

Figure 4:
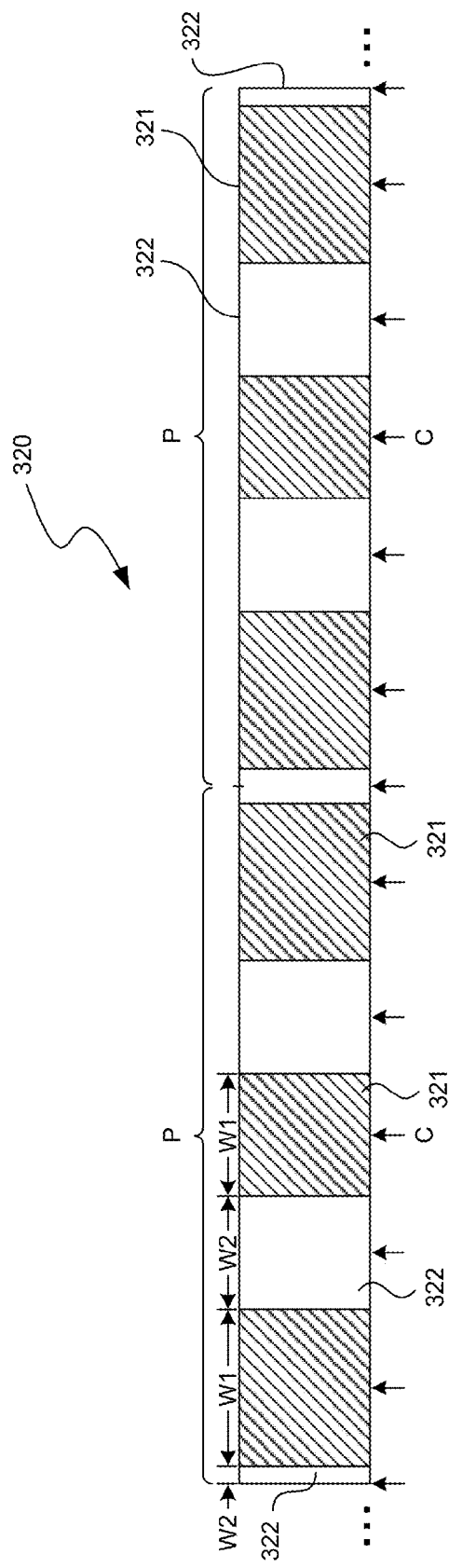
FIG. 4 is a partially schematic illustration of an alignment marker having first and second features positioned in accordance with an embodiment of the disclosure.

FIG. 4 is an enlarged, partially schematic illustration of a portion of one of the first structures 320 shown in FIG. 3. The second structure 330 shown in FIG. 3 can have a similar arrangement, generally with feature dimensions scaled up or down as will be discussed further later. In particular, FIG. 4 illustrates two adjacent pitches P of the first structure 320. Each pitch is generally equal to its neighbors, but in certain embodiments, the pitches can differ. Each of the pitches P includes a repeating pattern of first features 321 and second features 322. The centers of each of the features 321, 322 along the pitch direction are indicated by upwardly pointing arrows, with the center of each pitch P identified by arrow C. The widths of representative features are identified above the feature by the letters W1 for first features 321 and W2 for second features 322.

In a particular aspect of the embodiment shown in FIG. 4, the widths W1 of the first features 321 within the pitch P are not all equal to each other, and the widths W2 of the second features 322 within the pitch P are also not all equal to each other. In other words, at least one of the first features 321 within the pitch P has a different width W1 than at least one of the other first features 321, and at least one of the second features 322 has a different width W2 than at least one of the other second features 322. As described further below, it is expected that this arrangement will produce higher diffraction orders with increased intensity, in a manner that is expected to allow the chip manufacturer to align semiconductor wafers at both a coarse resolution and a fine resolution with improved accuracy.

Figure 5:
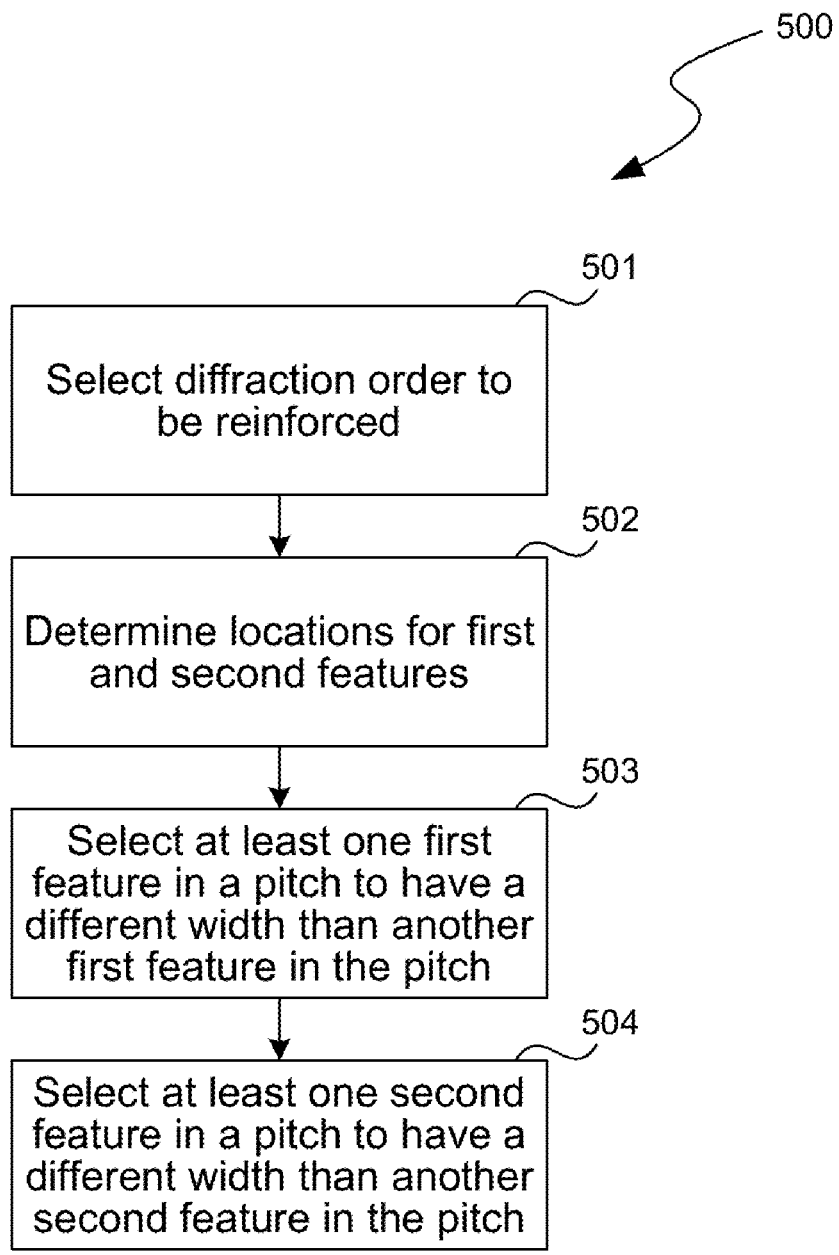
FIG. 5 is a flow diagram illustrating a process for making alignment markers in accordance with an embodiment of the disclosure.

FIG. 5 is a flow diagram illustrating a process 500 for determining the characteristics of features of an alignment marker, in accordance with an embodiment of the disclosure. Process portion 501 includes selecting a target diffraction order N to be reinforced, emphasized or enhanced. The selected target diffraction order is one that has an increased intensity compared to the same diffraction order produced by an existing alignment marker arrangement. The selected diffraction order is typically higher than one, for example, three, five or seven. Many of the embodiments described below are described in the context of enhancements for diffraction orders having odd integer values. In other embodiments, similar techniques can be used to enhance higher diffraction orders having even integer values.

In process portion 502, the locations for first and second features are determined. In the following discussion, the locations are typically characterized by the location of the center of a feature, relative to the center of the pitch. In other embodiments, the locations may be described with reference to other aspects of the features and/or the pitch. As used herein, the first features are features that generate first phase portions of an interference pattern, and the second features are features that generate second phase portions of the interference pattern, with the second phase being opposite the first phase. For example, the first features may generate light areas in a resulting diffraction pattern, and the second features may generate dark areas in the pattern. The phase relationship between the first and second features can be reversed in other embodiments, but in general, the first and second features are associated with portions of the interference pattern having opposite phases, for ease of detectability. The features can include plateaus or projections and trenches or depressions, lines (or bands) and blanks, or other elements that generate the desired phase relationship in an interference pattern.

In process portion 503, at least one first feature within a pitch of the alignment marker is selected to have a different width than another first feature in the pitch. In process portion 504, at least one second feature in the pitch is selected to have a different width than another second feature in the pitch. The spacing between first and second features is expected to enhance the detectability of higher diffraction orders while allowing adequate lower order (e.g. first order) signals, and the different feature widths is expected to allow first and second structures, each having different feature widths to be used together to facilitate coarse alignment.

Figure 6:
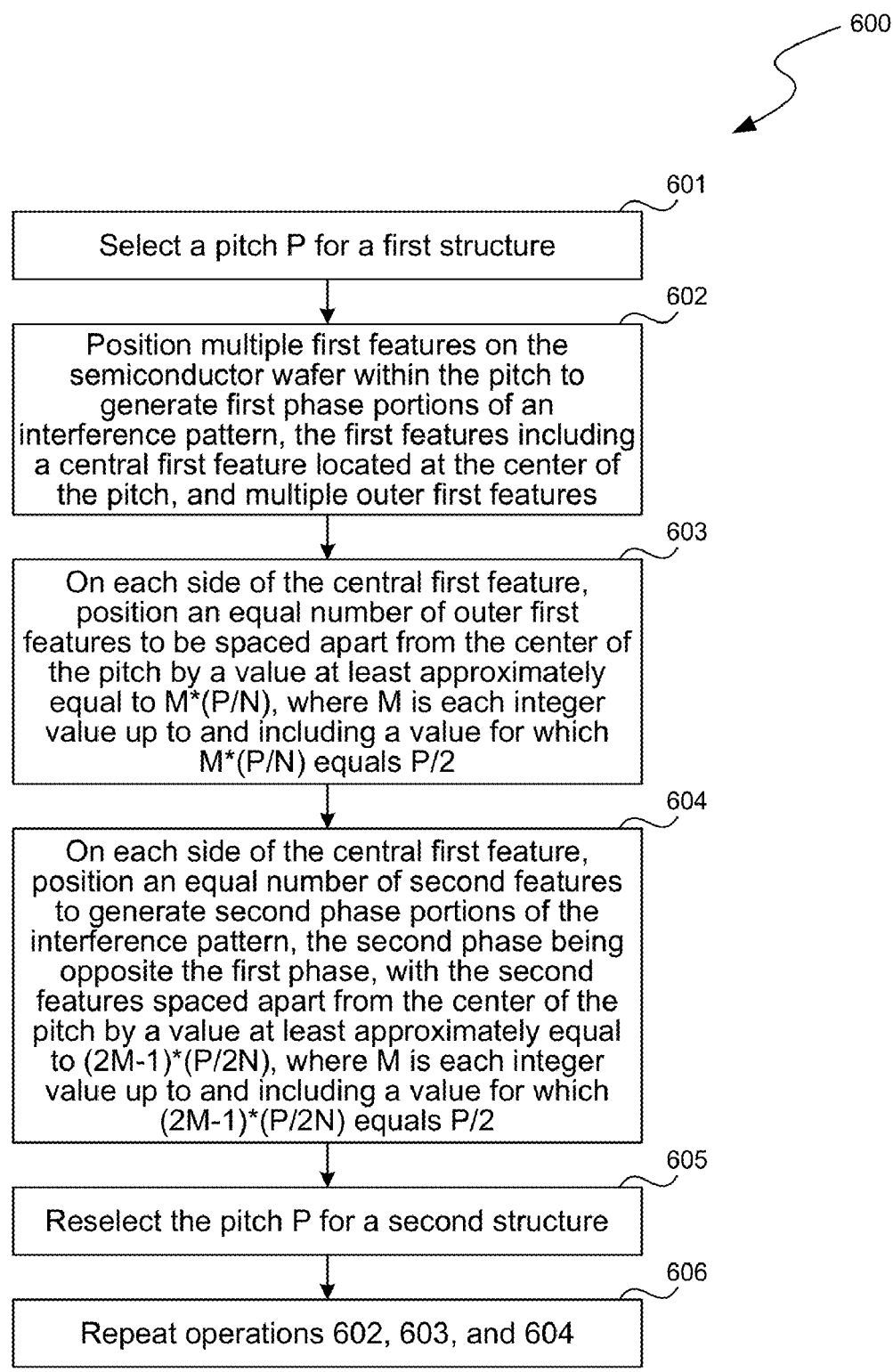
FIG. 6 is a flow diagram illustrating a process for making alignment markers in accordance with another embodiment of the disclosure.

FIG. 6 is a flow diagram illustrating a specific process 600 for determining the locations of the first and second features, as described above with reference to process portion 502 in FIG. 5. Once the locations of the first and second features are identified, the widths of the features can be selected in accordance with process portions 503 and 504 described above with reference to FIG. 5. However, aspects of the location determination, by themselves, are also unique relative to existing techniques, and are described further below.

Process 600 includes selecting a pitch P for a first structure (process portion 601) and positioning multiple first features on the semiconductor wafer within the pitch to generate first phase portions of an interference pattern (process portion 602). The first features include a central first feature located at the center of the pitch, and multiple outer first features. In process portion 603, an equal number of outer first features are positioned on each side of the central first feature. The outer first features are spaced apart from the center of the pitch by a value at least approximately equal to $M*(P/N)$, where M is each integer value up to and including a value for which $M*(P/N)=P/2$, and where N is the target diffraction order. Accordingly, process portion 603 is used to identify the locations of each of the outer first features. The outer first features can enhance or increase the intensity of the target diffraction order N.

In process portion 604, the locations of the second features are determined. In particular, on each side of the central first feature, an equal number of second features are positioned to generate second phase portions of the interference pattern, with the second phase being opposite the first phase, and with the second features spaced apart from the center of the pitch by a value at least approximately equal to $(2M-1)*(P/2N)$, where M is each integer value up to and including a value for which $(2M-1)*(P/2N)=P/2$.

Process portions 601-604 can be used to identify the locations of first and second features for the first structure of an alignment marker, and can then be repeated to identify the locations for the first and second features of the second structure of the alignment marker. For example, process portion 605 includes reselecting the pitch P for the second structure, and process portion 606 includes repeating the operations conducted in process portions 602, 603, and 604. Representative illustrations of the foregoing processes and resulting alignment structures are described further below.

Figure 7A:
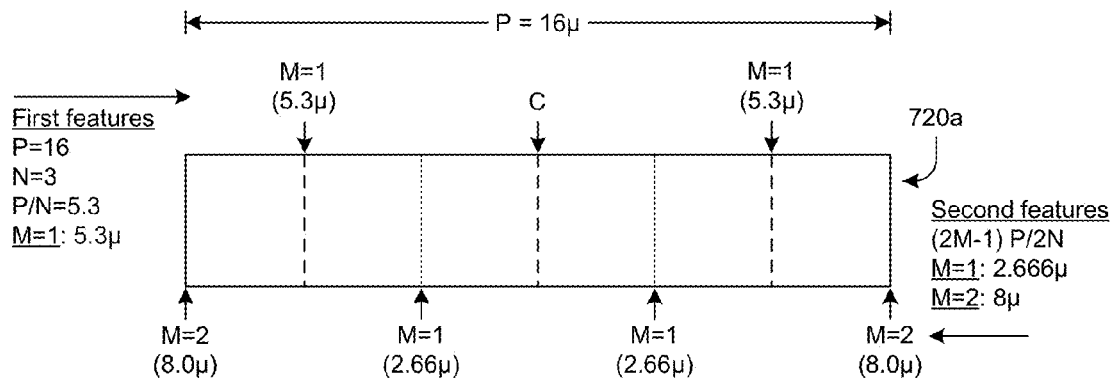
FIGS. 7A-7C schematically illustrate a process and associated alignment markers configured to emphasize a third diffraction order in accordance with an embodiment of the disclosure.

FIG. 7A illustrates a representative first structure 720a with just the centerlines of first and second features identified. The dimensions identified in FIG. 7A and the following Figures are indicated in microns. Particular Figures illustrate 16 micron pitches but the pitches can have other values in other embodiments. The centerline of the central first feature is at the center of the pitch and is identified by the letter C. The centerlines for the remaining outer first features and the second features are calculated using the process described above with reference to FIG. 6. For M=1, the outer first features are located at 5.33 microns from the center C, and the second features are located at 2.66 microns from the center C. For M=2, there are no first features within the pitch P, and the second features are located 8 microns from the center C. The centerlines for the outer first features are indicated with downward pointing arrows in FIG. 7A. The centerlines for the second features are indicated with upward pointing arrows.

Figure 7B:
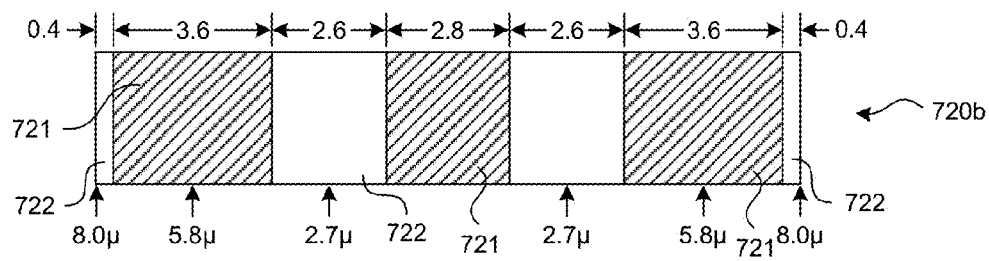

Once the locations for the first and second features are identified, the widths for each of the features may be selected. FIG. 7B illustrates a first structure 720b with all the feature centerlines identified by upwardly pointing arrows. The widths of each first feature 721 and each second feature 722 are indicated at the top of the first structure 720b. As is evident from FIGS. 7A and 7B, in an embodiment in which the third diffraction order (N=3) is to be emphasized, the resulting structure 720b has three first features 721 and four second features 722. As is also evident from FIG. 7B, the first features 721 do not all have the same width within the pitch P, and the second features 722 do not all have the same width within the pitch P. In particular, the first features 721 have widths of 3.6 microns and 2.8 microns, and the widths of the second features 722 have widths of 2.6 microns and 0.4 microns. These values can be different in other embodiments.

FIG. 7B also indicates that the centerline locations of the first and second features 721, 722 need not exactly conform to the values shown in FIG. 7A. In a particular embodiment, the values can be within ±5 microns of the calculated centerline values, and in other embodiments, the values can be within ±2 microns, ±1 microns or another suitable value.

Figure 7C:
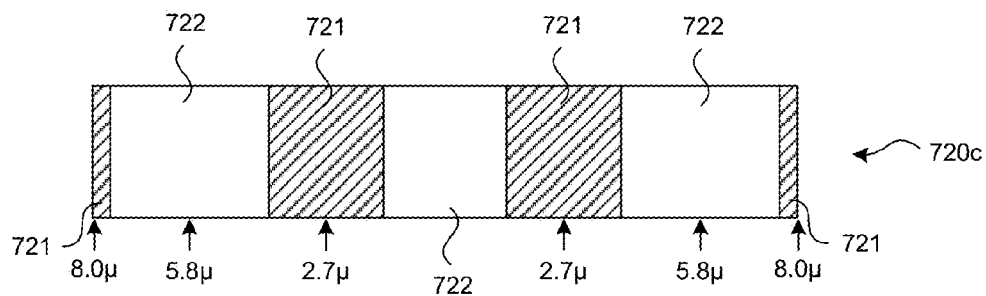

FIG. 7C illustrates a first structure 720c having first and second features 721, 722 that are arranged in the opposite fashion of that shown in FIG. 7B. In particular, at each location of a first feature 721 in 7B, FIG. 7C has a second feature 722, and vice versa. Either of the arrangements shown in FIGS. 7B and 7C can be suitable for wafer alignment, depending upon the settings or other characteristics of the detector. In either embodiment, at least one first feature 721 within a given pitch P has a different width than another first feature 721 within the pitch, and at least one second feature 722 within the pitch P has a different width than another second feature 722 within the pitch. Though not shown in FIGS. 7B and 7C, the first structure 720b, 720c is typically placed adjacent to a corresponding second structure that has first and second features 721, 722 with similar or identical locations and spacings, but scaled up or down relative to the pitch P of the first structure 720b, 720c. For example, the second structure can have a pitch P that is 10% larger than the pitch P shown in FIGS. 7B and 7C. The widths and centerline locations of the first and second features 721, 722 of the second structure are then scaled by the same factor.

During operation, a wafer having one or more wafer alignment markers with first and second structures configured in accordance with the foregoing process is aligned and processed at one or more work stations including but not limited to a scanning station. The wafer is aligned in both X and Y directions using the orthogonal markers shown and described above with reference to FIG. 3. The wafer can undergo a coarse alignment using the interference pattern generated by both the first and second structures 320, 330 of each alignment marker, and then can undergo a fine alignment using the interference pattern from one structure (e.g., the first structure 320) in each direction. In a representative example, the coarse alignment process has a capture range of about ±44 microns (e.g., for two structures having pitches of 16 microns and 17.6 microns, respectively) and the fine alignment process has a capture range of about ±4 microns, and a mark position accuracy of about ±4 nanometers.

At one or more points during the fabrication process, the manufacturer can assess wafer quality, e.g., the ratio or percentage of wafers that pass quality control, compared to a baseline. The wafer quality is generally affected by the ability of the wafer alignment markers to successfully withstand wafer processing steps, which in turn is affected by the design of the wafer alignment markers. Accordingly, the water quality can provide a measure of the effectiveness of the alignment marker design, as discussed below.

Figure 8:
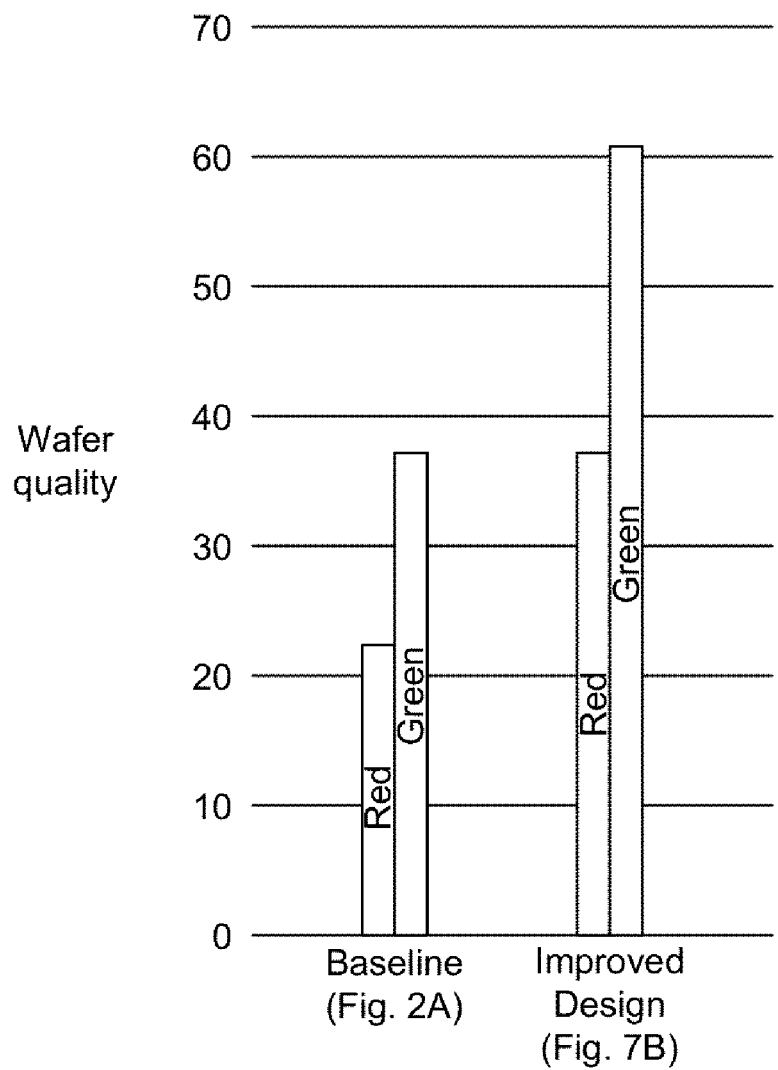
FIG. 8 is a graph illustrating the wafer quality values expected from an alignment marker configured to emphasize a third diffraction order in accordance with an embodiment of the disclosure, as compared to a prior art alignment marker.

FIG. 8 is a graph illustrating the wafer quality for a baseline alignment marker (e.g., similar to that shown in FIG. 2A) and an improved design in accordance with an embodiment of the present disclosure (e.g., similar to that shown in FIG. 7B). Results are illustrated for red and green illuminating radiations, for a structure oriented along the X axis. Results follow generally similar trends for alignment structures oriented along the Y axis. As is shown in FIG. 8, the wafer quality associated with the alignment marker shown in FIG. 7B is significantly greater than that for the baseline alignment marker shown in FIG. 2A. One expected reason for this result is that the outer first structures 722 shown in FIG. 7B can assist or aid in directing radiation to the third diffraction order and away from the first diffraction order. It is expected that this arrangement is more robust than existing arrangements, particularly for wafers that undergo a variety of deposition and removal processes.

Another feature of the arrangement shown in FIG. 7B is that the widths of at least one of the first structures is different than a corresponding width of at least one of the other first structures within a pitch, and the same is true for the second structures. This arrangement may tend not to shift as much energy from the first order to the third order as a design having all the first features with equal widths and all the second features with equal widths. However, by selecting the widths to be unequal, the energy is not entirely diverted from the first order. This is important for coarse alignment, which relies upon the first diffraction order of the interference pattern. Accordingly, alignment structures having the characteristics shown and described above can emphasize higher order diffraction patterns in a manner that facilitates fine alignment, without sacrificing the first order diffraction pattern used to perform coarse alignment.

Figure 9A:
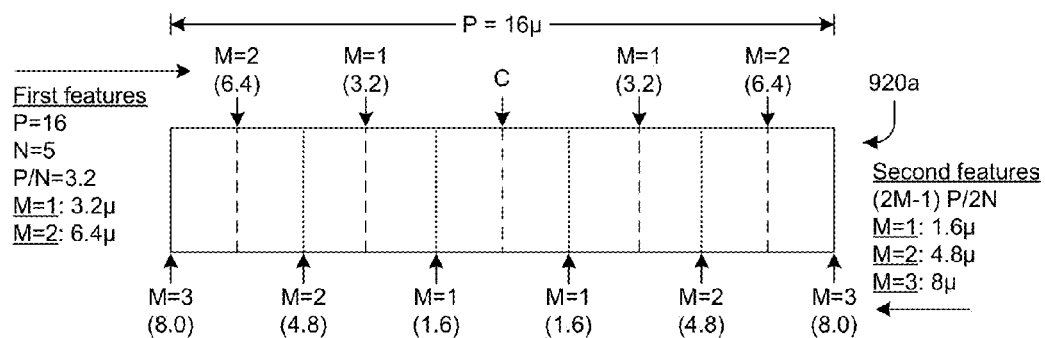
FIGS. 9A-9C schematically illustrate a process and associated alignment markers configured to emphasize a fifth diffraction order in accordance with an embodiment of the disclosure.
Figure 9B:
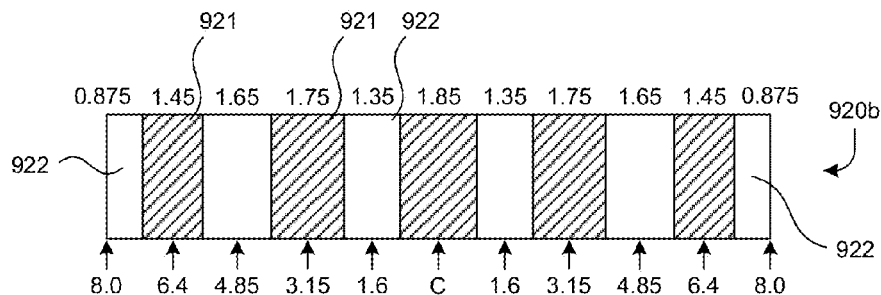

FIG. 9A is a schematic illustration of a first structure 920a having centerline locations selected to emphasize the fifth diffraction order. First feature centerline locations are shown for values of M=1 and M=2 along the top of the first structure 720a. Second feature centerline locations are shown for values of M=1, M=2 and M=3 along the bottom of the structure 920a. FIG. 9B illustrates a representative first structure 920b, with centerline locations indicated along the bottom of the structure, and widths indicated along the top of the structure. FIG. 9B illustrates that the centerline locations need not comply exactly with the values calculated and shown in FIG. 9A, but may be within a particular range. For example, the values may differ from the calculated value by ±0.05 micron, ±0.1 micron, ±0.2 micron, or ±0.5 micron, and remain at least approximately equal to the calculated value.

Figure 9C:
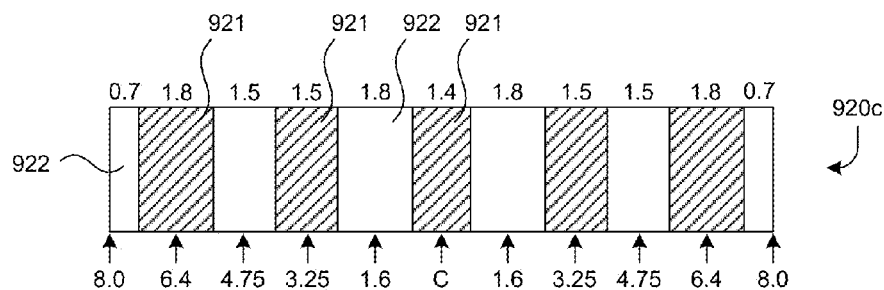

FIG. 9C illustrates another first structure 920c having centerline locations that also deviate in an acceptable manner from the values calculated and shown in FIG. 9A. FIGS. 9B and 9C both illustrate first and second features 921, 922 that have unequal widths within the pitch P.

Figure 10A:
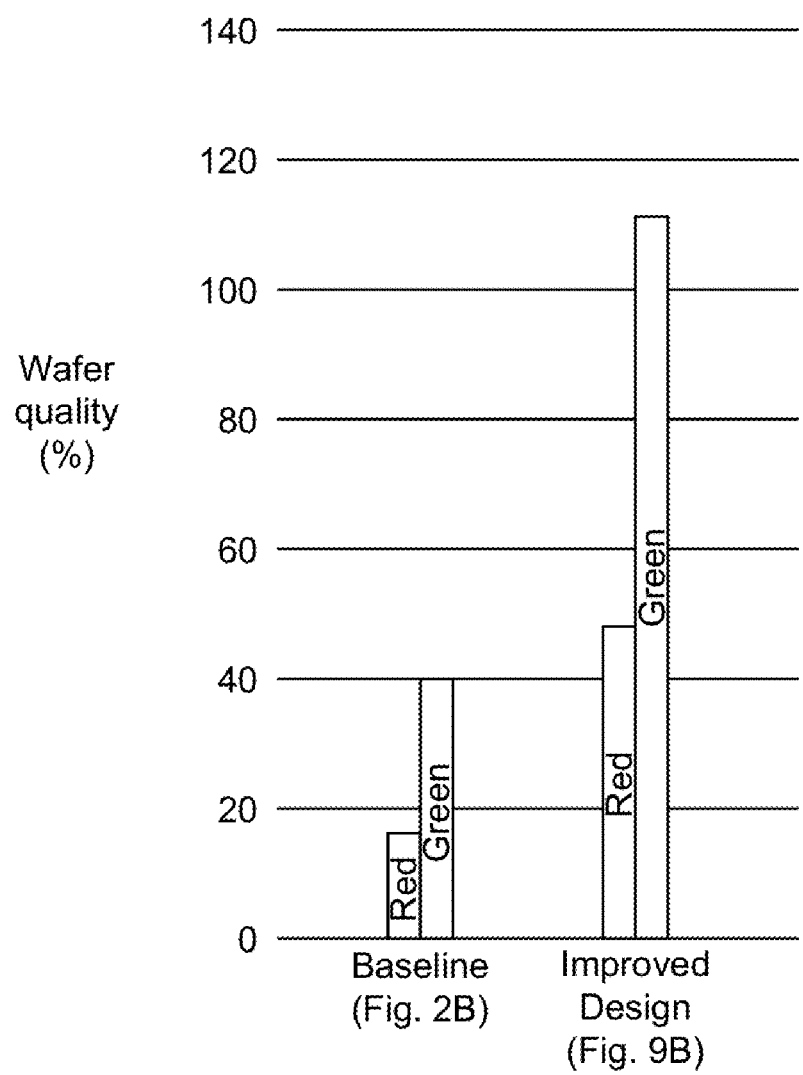
FIG. 10A is a graph illustrating the wafer quality values expected from an alignment marker configured to emphasize the fifth diffraction order in accordance with an embodiment of the present disclosure, as compared to a prior art alignment marker.

FIG. 10A is a graphical comparison of wafer quality for a baseline (prior art) design (e.g., similar to the design shown in FIG. 2B) and an improved design in accordance with an embodiment of the present disclosure (e.g., similar to the design shown in FIG. 9B). FIG. 10A illustrates the significant increase in wafer quality resulting from positioning and sizing the first and second features in the manner described above with reference to FIGS. 9A-9C.

Figure 10B:
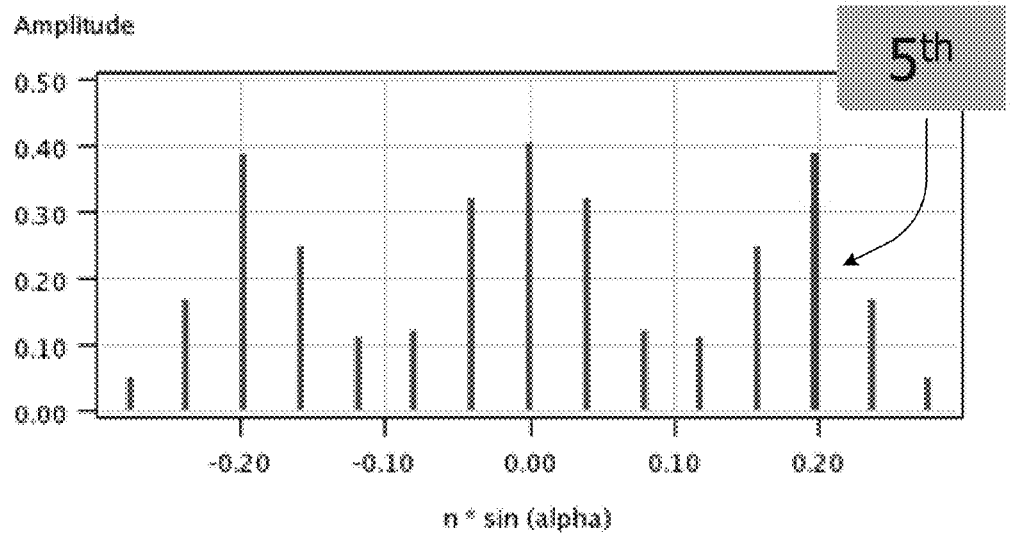
FIG. 10B is a graph illustrating the expected amplitude detected using an alignment marker configured in accordance with the prior art.
Figure 10C:
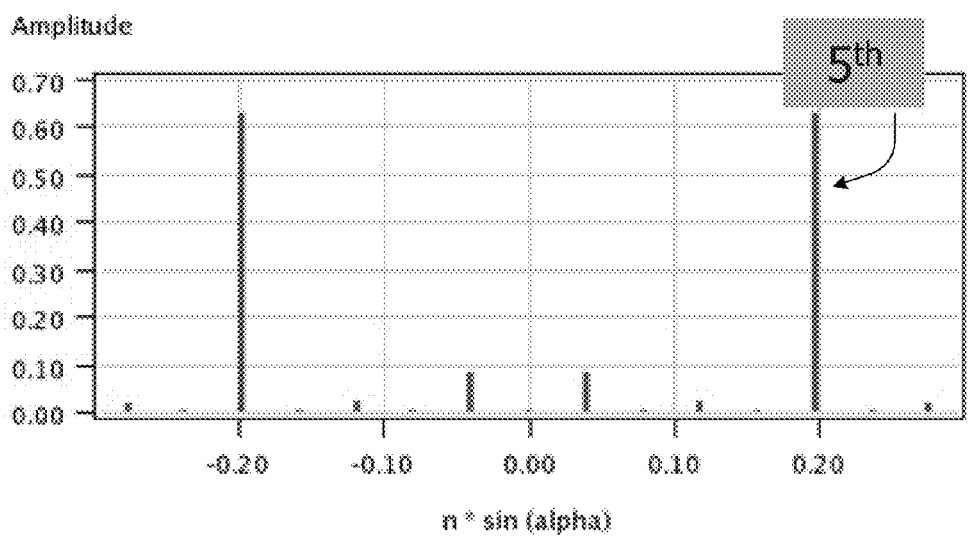
FIG. 10C is a graph illustrating the expected amplitude detected using an alignment marker configured to emphasize the fifth diffraction order in accordance with the present disclosure.

FIG. 10B illustrates the expected (nondimensionalized) amplitude of the detected radiation received when a wafer with the baseline (prior art) design alignment mark (shown in FIG. 2B) is irradiated, based on a numerical simulation. FIG. 10C illustrates the corresponding expected amplitude for a wafer with the improved alignment markers shown in FIG. 9B. Each bar in FIGS. 10B, 10C corresponds to a diffraction order, with the zeroth diffraction order at 0.00. FIG. 10C illustrates that an embodiment of the present design more efficiently emphasizes the fifth order than does the design shown in FIG. 10B. At the same time, the first diffraction order associated with the present design still has a measurable amplitude, and, in particular, an amplitude specifically selected to be sufficient for coarse alignment, as described above.

Figure 11A:
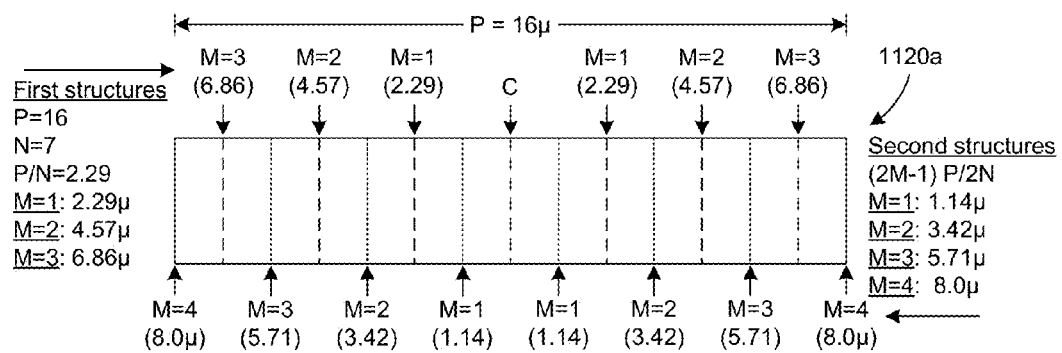
FIGS. 11A and 11B illustrate a process and associated alignment marker configured to emphasize a seventh diffraction order in accordance with an embodiment of the disclosure.
Figure 11B:
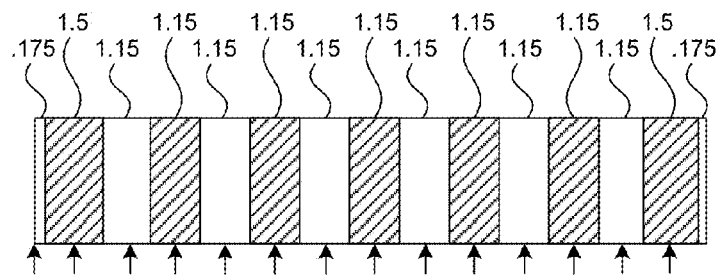

FIG. 11A illustrates a first structure 1120a having first and second feature centerlines selected to emphasize the seventh diffraction order in accordance with another embodiment of the disclosure. As shown in FIG. 11A, the centerline values for the first features are calculated for values of M=1, 2, and 3, and the centerline values for the second features are calculated for values of M=1, 2, 3 and 4. FIG. 11B illustrates representative widths and locations for the resulting first and second features. As described above with reference to FIGS. 7B, 7C, 9B, and 9C, the first features do not all have the same width, and the second features do not all have the same width.

Figure 2C:
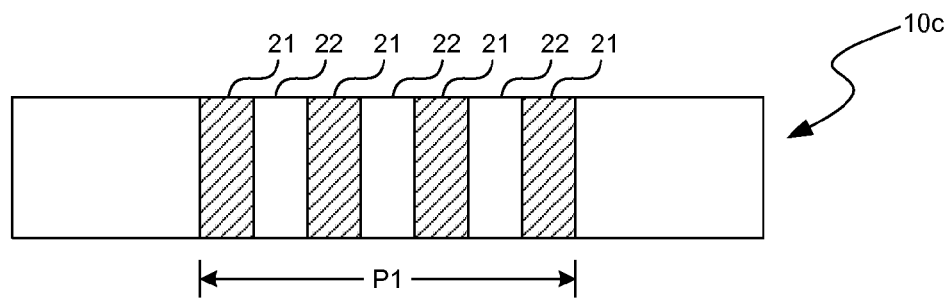
Figure 2D:
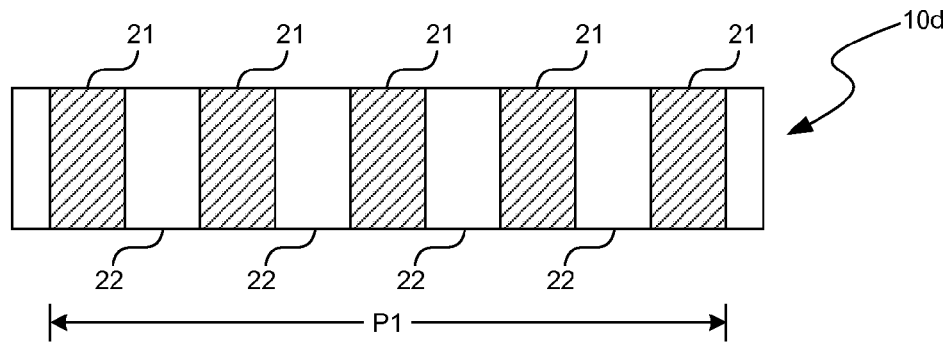
Figure 12:
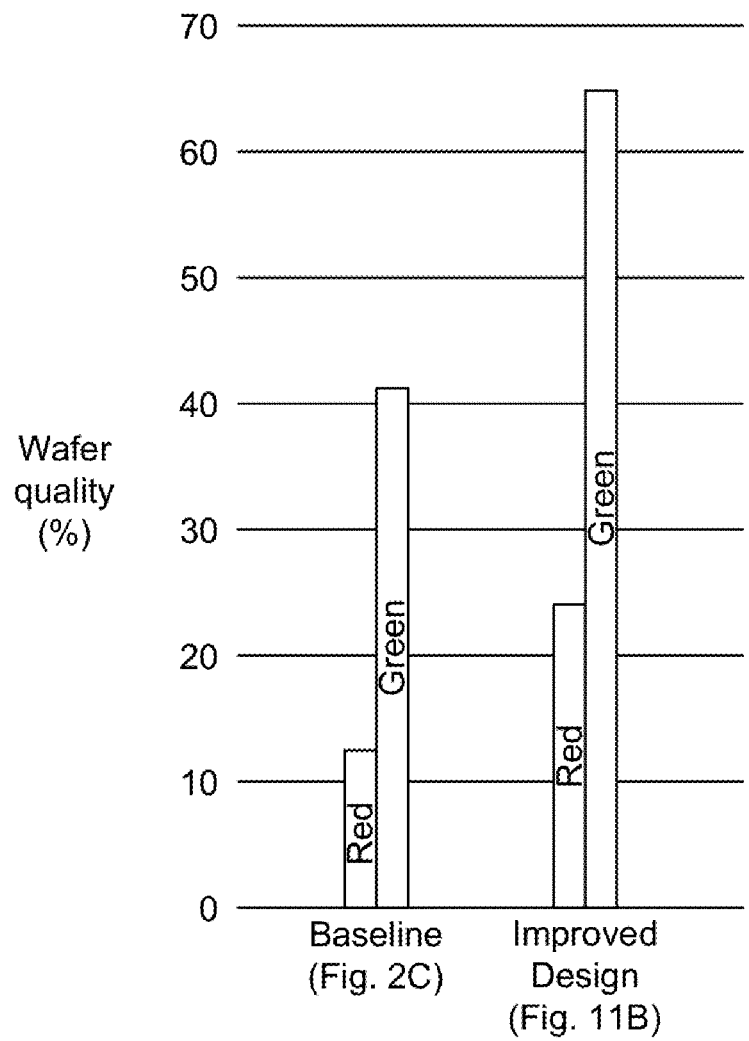
FIG. 12 is a graph illustrating the wafer quality values expected from an alignment marker configured to emphasize the seventh order in accordance with an embodiment of the present disclosure, as compared to an alignment marker in accordance with the prior art.

FIG. 12 compares the wafer quality values for a baseline alignment marker (e.g., the marker shown in FIG. 2C) with an improved alignment marker design in accordance with an embodiment of the present disclosure (e.g., as show in FIG. 11B). Again, the wafer quality results indicate a significant improvement when compared with the baseline mark.

Figure 13A:
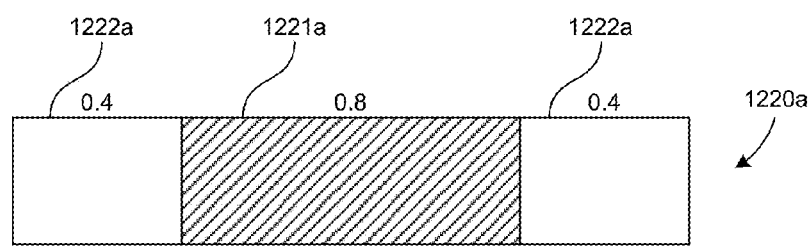
FIGS. 13A and 13B illustrate an existing alignment marker (FIG. 13A) and an alignment marker that emphasizes a third diffraction order in accordance with an embodiment of the disclosure (FIG. 13B).
Figure 13B:
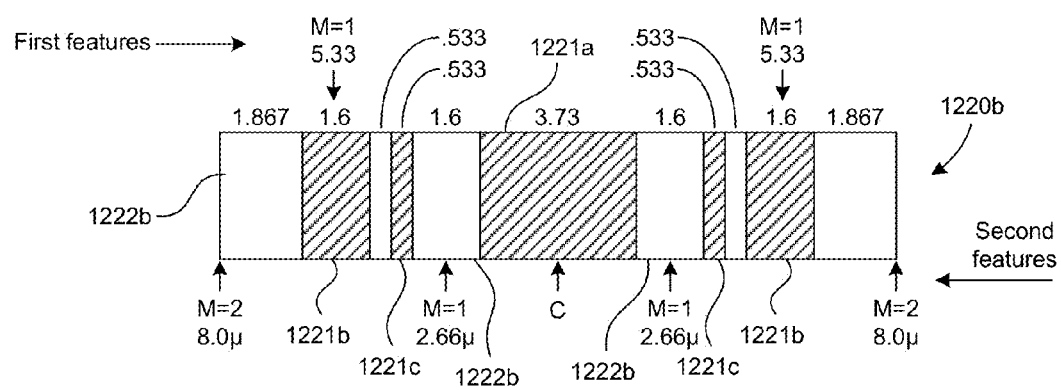
Figure 14:
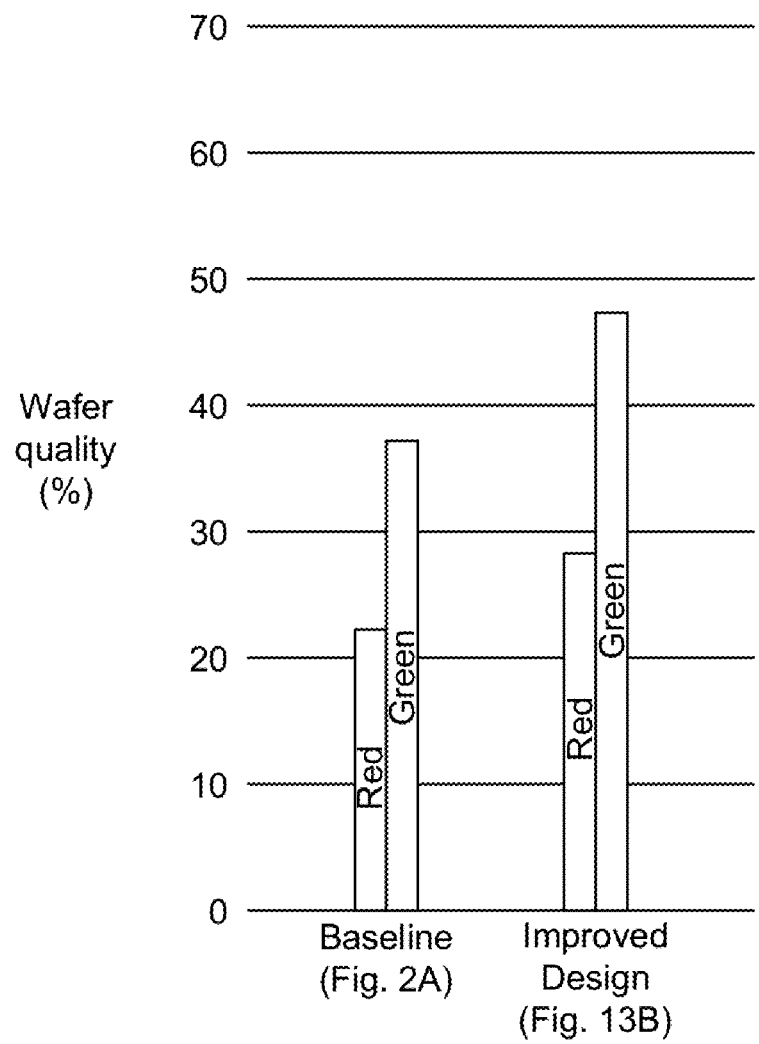
FIG. 14 is a graph illustrating wafer quality values expected for an alignment marker configured to emphasize a third diffraction order in accordance with an embodiment of the disclosure, as compared with a prior art alignment marker.

In any of the foregoing embodiments, the locations and widths of the first and second features may be established by using a photolithography process in which the wafer is selectively exposed to radiation passing through a suitable reticle. The resulting alignment markers features may have the locations described above with reference to FIG. 6. In other embodiments, the locations of the features may have other values, but with the first features and second features having non-uniform widths, as described above. For example, FIG. 13A illustrates a single pitch of an existing alignment marker 1220a (shown in FIG. 1 as alignment marker 10), with first features 1221a and second features 1222a. In FIG. 13B, an alignment marker 1220b in accordance with the present disclosure has been formed with portions of the central first feature 1221a shown in FIG. 13A shifted outwardly to produce two outer first features 1221b centered at the same M=1 locations as those described above with reference to FIG. 7A. Residual portions of the first feature 1221a shown in FIG. 13A may remain, as identified by first features 1221c. Second features 1221b are located between neighboring first features 1221b, 1221c. This arrangement may detract from the performance of the structure shown in FIG. 13B. However, as shown in FIG. 14, this structure is expected to outperform the baseline (prior art) structure shown in FIG. 2A. In particular, while the numbers and widths of the first and second features of the alignment marker 1220b may be different than those of the alignment marker 720b shown in FIG. 7B (which also emphasizes the third diffraction order), because at least one first feature has a different width than another first feature in the pitch, and at least one second feature has a different width than another second feature in the pitch, the mark is expected to produce good fine alignment characteristics and, when used in combination with a second structure having features designed in a similar manner, good coarse alignment characteristics as well.

As discussed above, it is expected that the combination of alignment structures having first features with unequal widths, and second features with unequal widths, along with the centerline spacing for these features, will produce interference patterns that enhance selected higher diffraction orders (to facilitate fine alignment) without unduly sacrificing the lower diffraction order (to maintain the ability to provide coarse alignment). In particular, the outer features of the markers are expected to enhance selected diffraction orders, and the unequal feature widths are expected to facilitate coarse alignment. Accordingly, an advantage of this arrangement is that it is expected to be more robust than existing structures for both coarse and fine alignment, even after the structures are subjected to multiple deposition and planarization operations.

From the foregoing, it will be appreciated that specific embodiments of the disclosure have been described herein for purposes of illustration, but that various modifications may be made without deviating from the disclosure. For example, several aspects of the structures were described above in the context of first structures, and in a typical application, will be applied in a generally similar manner to associated second structures to produce an overall marker suitable for both fine and coarse alignment. The sum of the widths of the first features within a given pitch can equal the sum of the widths of the second features within the pitch, in some embodiments. This arrangement can correspond to a "duty cycle" at 50%. In other embodiments, these sums can differ, and the associated duty cycles can range from, e.g., 30% to 70%. The dimensions of the alignment markers and associated features of the markers can have values different than those described above, in particular embodiments.

Certain aspects described above in the context of particular embodiments may be combined or eliminated in other embodiments. For example, the relative positions and widths of any of the first and second features may be interchanged, depending upon the characteristics of the associated detection device. In addition, the structures may include other features in addition to those shown in the foregoing Figures, including features (e.g., posts) that are selected to prevent "dishing" of the alignment markers during CMP operations, without unduly interfering with the resulting interference patterns. Further, while advantages associated with certain embodiments have been described in the context of those embodiments, other embodiments may also exhibit such advantages, and not all embodiments need necessarily exhibit such advantages to fall within the scope of the present disclosure. Accordingly, the disclosure can encompass other embodiments not expressly shown or described herein.

We claim:

1. A semiconductor wafer, comprising:
a wafer substrate having an alignment marker, the alignment marker including:
a first structure and a second structure, each structure having:
a pitch;
first features positioned in the pitch to generate first phase portions of an interference pattern, at least one of the first features having a width different than that of another of the first features in the pitch; and
second features positioned adjacent to the first features in the pitch to generate second phase portions of the interference pattern, the second phase portions having a second phase opposite the first phase, at least one of the second features having a width different than that of another of the second features in the pitch;
wherein the pitch for the first structure is different than the pitch for the second structure.

2. The wafer of claim 1, wherein the pitch of the first structure is approximately 16 microns.

3. The wafer of claim 1 wherein the pitch of the second structure is approximately 10% greater than the pitch of the first structure.

4. The wafer of claim 1 wherein:
widths of all the first features in the pitch sum to a first value; and
widths of all the second features in the pitch to sum to a second value approximately the same as the first value.

5. The wafer of claim 1, wherein:
widths of all the first features in the pitch sum to a first value; and
widths of all the second features in the pitch sum to a second value different than the first value.

6. The wafer of claim 1 wherein the first and second features alternate within the pitch.

7. A semiconductor wafer, comprising:
a wafer substrate having an alignment marker, the alignment marker including:
a first structure and a second structure, each having a pitch P and an integer target diffraction order N, where N is an integer >1, each structure including:
(a) multiple first features positioned within the pitch P to generate first phase portions of an interference pattern, the first features including a central first feature located at the center of the pitch, and multiple outer first features;
(b) on each side of the central first feature, an equal number of outer first features, spaced apart from the center of the pitch by a value at least approximately equal to $M*(P/N)$, where M is each positive integer value up to and including a value for which $M*(P/N)$ equals $P/2$; and
(c) on each side of the central first feature, an equal number of second features positioned to generate second phase portions of the interference pattern, the second phase portions having a second phase opposite the first phase, the second features being spaced apart from the center of the pitch by a value at least approximately equal to $(2M-1)*(P/2N)$, where M is each positive integer value up to and including a value for which $(2M-1)*(P/2N)$ equals $P/2$;
wherein the pitch P for the first structure is different than the pitch P for the second structure, and the target diffraction order N for each of the first and second structures is the same.

8. The wafer of claim 7 wherein the integer target diffraction order is 3.

9. The wafer of claim 7 wherein the integer target diffraction order is 5.

10. The wafer of claim 7 wherein the integer target diffraction order is 7.

11. The wafer of claim 7 wherein the widths of at least two of the first features in the pitch are unequal.

12. The wafer of claim 7 wherein the widths of at least two of the second features in the pitch are unequal.

13. The wafer of claim 7 wherein the widths of at least two of the first features in the pitch are unequal and the widths of at least two of the second features in the pitch are unequal.

14. A method for making an alignment marker for a semiconductor wafer, comprising:
selecting a reinforced diffraction order N, where N is an integer >1;
selecting a pitch P equal to a pitch distance;
for a first structure of the alignment marker:
(a) positioning multiple first features on the semiconductor wafer within the pitch to generate first phase portions of an interference pattern, the first features including a central first feature located at the center of the pitch, and multiple outer first features;
(b) on each side of the central first feature, positioning an equal number of outer first features to be spaced apart from the center of the pitch by a value at least approximately equal to $M*(P/N)$, where M is each positive integer value up to and including a value for which $M*(P/N)$ equals $P/2$;
(c) on each side of the central first feature, positioning an equal number of second features to generate second phase portions of the interference pattern, the second phase being opposite the first phase, with the second features spaced apart from the center of the pitch by a value at least approximately equal to $(2M-1)*(P/2N)$, where M is each positive integer value up to and including a value for which $(2M-1)*(P/2N)$ equals $P/2$;
for a second structure of the marker, adjacent to the first structure:
reselecting the pitch p to be greater than or less than the pitch distance; and
repeating operations (a), (b) and (c).

15. The method of claim 14 wherein selecting N includes selecting N to be 3.

16. The method of claim 14 wherein selecting N includes selecting N to be 5.

17. The method of claim 14 wherein selecting N includes selecting N to be 7.

18. The method of claim 14, further comprising selecting widths of at least two of first features in the pitch to be unequal.

19. The method of claim 14, further comprising selecting widths of at least two of the second features in the pitch to be unequal.

20. The method of claim 14, further comprising:
selecting widths of at least two of first features in the pitch to be unequal; and
selecting widths of at least two of the second features in the pitch to be unequal.

21. The method of claim 14, wherein selecting the pitch includes selecting the pitch to be approximately 16 microns.

22. The method of claim 14 wherein reselecting the pitch includes reselecting the pitch to be approximately 10% greater than the pitch distance.

23. The method of claim 14, further comprising:
selecting widths of all the first features in the pitch to sum to a first value; and
selecting widths of all the second features in the pitch to sum to a second value approximately the same as the first value.

24. The method of claim 14, further comprising:
selecting widths of all the first features in the pitch to sum to a first value; and
selecting widths of all the second features in the pitch to sum to a second value different than the first value.

25. A method for aligning a semiconductor wafer, comprising:
irradiating a semiconductor wafer alignment marker, the alignment marker having a first structure and second structure each having a pitch, each structure including:
first features in the pitch, with at least one of the first features in the pitch having a width different than a width of another first feature in the pitch;
second features in the pitch, with at least one of the second features in the pitch having a width different than a width of another second feature in the pitch;
wherein the pitch for the first structure is different than the pitch for the second structure;
producing an interference pattern with the first and second structures, with the first features generating portions of the interference pattern having a first phase and with the second features generating portions of the interference pattern having a second phase opposite the first phase;
adjusting a coarse alignment of the wafer based on the interference pattern resulting from the irradiation of the first and second structures; and
adjusting a fine alignment of the wafer based on the interference pattern resulting from irradiation of one of the first and second structures.

26. The method of claim 25 wherein producing the interference pattern includes reinforcing portions of the interference pattern created by at least one inner first feature with at least one outer first feature.

27. The method of claim 25 wherein producing the interference pattern includes reinforcing a target diffraction order greater than the first diffraction order, and wherein the different width of the at least one first feature and the different width of the at least one second feature reduces the reinforcement of the target diffraction order.

* * * * *